(12) United States Patent
Teranishi et al.

(10) Patent No.: US 9,450,070 B2
(45) Date of Patent: Sep. 20, 2016

(54) METHOD FOR MANUFACTURING A SILICON SEMICONDUCTOR SUBSTRATE INCLUDING A DIFFUSION LAYER PRIOR TO FORMING A SEMICONDUCTOR DEVICE THEREON

(71) Applicant: FUJI ELECTRIC CO., LTD., Kawasaki-shi (JP)

(72) Inventors: Hideaki Teranishi, Hachioji (JP); Haruo Nakazawa, Matsumoto (JP); Masaaki Ogino, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/511,862

(22) Filed: Oct. 10, 2014

(65) Prior Publication Data
US 2015/0031175 A1   Jan. 29, 2015

Related U.S. Application Data

(63) Continuation of application No. PCT/JP2013/065104, filed on May 30, 2013.

(30) Foreign Application Priority Data

May 31, 2012   (JP) ................................ 2012-124176

(51) Int. Cl.
*H01L 21/425* (2006.01)
*H01L 29/66* (2006.01)
(Continued)

(52) U.S. Cl.
CPC ..... *H01L 29/66333* (2013.01); *H01L 21/2252* (2013.01); *H01L 21/2253* (2013.01);
(Continued)

(58) Field of Classification Search
None
See application file for complete search history.

(56) References Cited

U.S. PATENT DOCUMENTS 5,310,531 A *   5/1994   Ikeda et al. ................... 423/324
5,902,135 A     5/1999   Schulze
(Continued)

FOREIGN PATENT DOCUMENTS

| JP | 60-092610 A | 5/1985 |
|---|---|---|
| JP | 03-193698 A | 8/1991 |

(Continued)

OTHER PUBLICATIONS

Satoru Matsumoto, "Diffusion Coefficient of Interstitial Silicon Atom", Faculty of Science and Technology, Keio University, vol. 80, No. 11, 2011.
(Continued)

*Primary Examiner* — Reema Patel
(74) *Attorney, Agent, or Firm* — Rabin & Berdo, P.C.

(57) ABSTRACT

A method for manufacturing a silicon semiconductor substrate including a diffusion layer prior to forming a semiconductor device thereon, includes providing a silicon semiconductor substrate which is manufactured by a floating zone method; and performing thermal diffusion at a heat treatment temperature that is equal to or higher than 1290° C. and that is lower than a melting temperature of a silicon crystal to form a diffusion layer with a depth of 50 μm or more in the silicon semiconductor substrate, the thermal diffusion including a first heat treatment performed in an atmosphere consisting of oxygen or oxygen and at least one of argon, helium, or neon, followed by a second heat treatment performed in an atmosphere comprised of nitrogen or nitrogen and oxygen to form the diffusion layer. The method suppresses the occurrence of crystal defects, reduces the amount of inert gas used, and reduces manufacturing costs.

22 Claims, 10 Drawing Sheets

(51) Int. Cl.
  *H01L 21/225* (2006.01)
  *H01L 21/761* (2006.01)
  *H01L 21/762* (2006.01)
  *H01L 29/16* (2006.01)

(52) U.S. Cl.
  CPC ........... *H01L21/761* (2013.01); *H01L 21/762* (2013.01); *H01L 29/16* (2013.01); *H01L 29/66325* (2013.01)

(56) References Cited

U.S. PATENT DOCUMENTS

| | | | |
|---|---|---|---|
| 6,165,826 A * | 12/2000 | Chau et al. | 438/231 |
| 7,741,192 B2 | 6/2010 | Shimoyama et al. | |
| 2006/0038206 A1 | 2/2006 | Shimoyama et al. | |
| 2010/0116194 A1* | 5/2010 | Togawa et al. | 117/13 |
| 2011/0215435 A1 | 9/2011 | Wakimoto et al. | |
| 2011/0291181 A1 | 12/2011 | Irifune et al. | |
| 2013/0260540 A1 | 10/2013 | Nakazawa et al. | |
| 2014/0377938 A1 | 12/2014 | Nakazawa et al. | |

FOREIGN PATENT DOCUMENTS

| | | | |
|---|---|---|---|
| JP | H04-042525 A | 2/1992 | |
| JP | 08-236735 A | 9/1996 | |
| JP | 2607853 B2 | 5/1997 | |
| JP | 09-227300 A | 9/1997 | |
| JP | 10-144945 A | 5/1998 | |
| JP | 2975912 B2 | 11/1999 | |
| JP | 2002-319676 A | 10/2002 | |
| JP | 2004-319653 A | 11/2004 | |
| JP | 2004-336008 A | 11/2004 | |
| JP | 2006-080269 * | 3/2006 | ............ H01L 29/78 |
| JP | 2006-080269 A | 3/2006 | |
| JP | 2006-303410 A | 11/2006 | |
| JP | 2007-314374 A | 12/2007 | |
| JP | 2008-171952 A | 7/2008 | |
| JP | 2010-003899 A | 1/2010 | |
| JP | 2011-003729 A | 1/2011 | |
| JP | 2011-181770 A | 9/2011 | |
| JP | 2011-249712 A | 12/2011 | |

OTHER PUBLICATIONS

Haruo Nakazawa et al., "Precipitate Caused in Silicon Crystal by High-Temperature Prolonged Annealing in Nitrogen", Waseda Univ., 2012.

Andrew S. Grove, "Pre-deposition" Ohmsha Kabushiki Kaisha, Jun. 23, 1995.

* cited by examiner

7 ··· THERMALLY-OXIDIZED FILM
8 ··· BORON DIFFUSION LAYER
9 ··· ARGON ATOM
10 ··· OXYGEN MOLECULE
11 ··· EXCESS Si IMPLANTATION (b)

FIG. 3

12 ··· NITROGEN MOLECULE
13 ··· p-TYPE CONDUCTIVE LAYER

METHOD FOR MANUFACTURING A SILICON SEMICONDUCTOR SUBSTRATE INCLUDING A DIFFUSION LAYER PRIOR TO FORMING A SEMICONDUCTOR DEVICE THEREON

This non-provisional Application is a continuation of and claims the benefit of the priority of Applicant's earlier filed International Application No. PCT/JP2013/065104 filed May 30, 2013, the entire contents of which are incorporated herein by reference.

BACKGROUND OF THE INVENTION

1. Field of the Invention

The present invention relates to a method for manufacturing a semiconductor device.

2. Description of the Related Art

In recent years, a matrix converter has been known as a direct-link-type conversion circuit which does not require a direct current (DC) smoothing circuit including, for example, an electrolytic capacitor or a DC reactor, in a power conversion circuit that performs alternating current (AC)/AC conversion, AC/DC conversion, and DC/AC conversion using a semiconductor element. Since the matrix converter is used at an AC voltage, a plurality of switching devices forming the matrix converter require a bidirectional switching device which can control a current in the forward direction and in the reverse direction.

Figure 9:
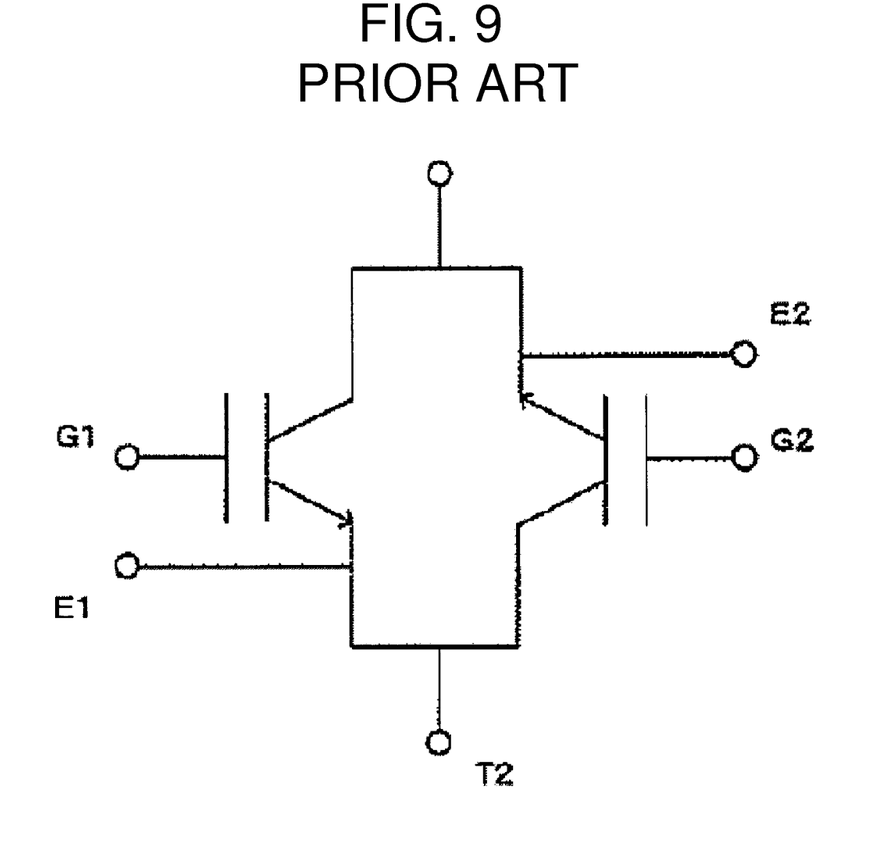
FIG. 9 is a circuit diagram illustrating an equivalent circuit of a bidirectional switching device using the reverse blocking IGBT.

In recent years, the bidirectional switching device having the following structure has been proposed in terms of reducing the size and weight of a circuit, improving efficiency and response, and reducing costs: two reverse blocking insulated gate bipolar transistors (IGBTs) are connected in inverse parallel to each other, as illustrated in the equivalent circuit diagram of FIG. 9. FIG. 9 is a circuit diagram illustrating the equivalent circuit of the bidirectional switching device using the reverse blocking IGBT. The inverse parallel connection structure of the reverse blocking IGBTs has the advantage that a diode for blocking a reverse voltage is not required. That is, the reverse blocking IGBT means a device which equalizes the reverse breakdown voltage to the forward breakdown voltage and has high reliability of breakdown voltage. In the general IGBT which is used in the power conversion circuit according to the related art, an effective reverse breakdown voltage is not required, similarly to the general transistor or insulated gate field effect transistor (MOSFET) without a reverse breakdown voltage. Therefore, an IGBT which has a reverse breakdown voltage lower than a forward breakdown voltage and has low reliability of breakdown voltage is enough for the bidirectional switching device.

Figure 8:
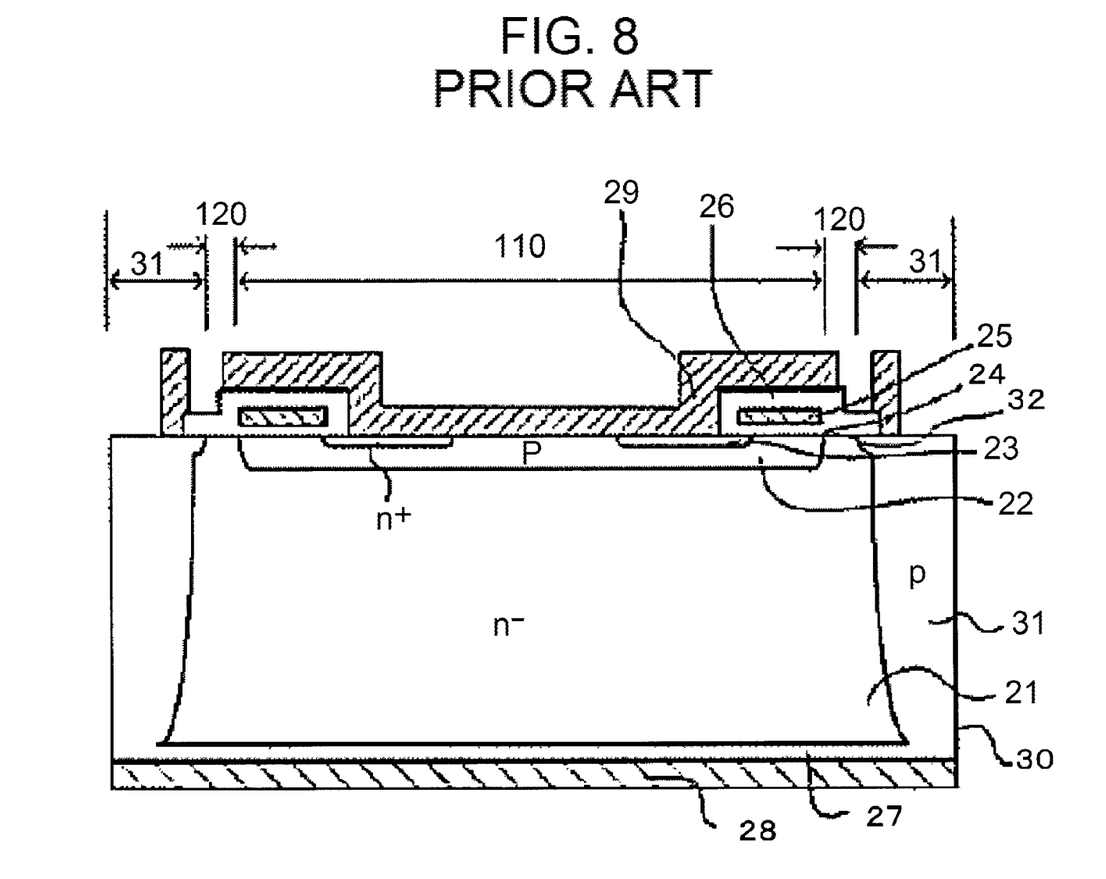
FIG. 8 is a cross-sectional view schematically illustrating the cross-sectional structure of the reverse blocking IGBT according to the related art.

Next, the structure of the reverse blocking IGBT according to the related art will be described. FIG. 8 is a cross-sectional view schematically illustrating the cross-sectional structure of the reverse blocking IGBT according to the related art. FIG. 8 is described in JP 2006-80269 A (Patent Document 1). The reverse blocking IGBT according to the related art has a structure in which an active region 110 is provided at the center, a breakdown voltage structure region 120 is provided in an outer circumferential portion surrounding the active region 110, and a p-type isolation layer 31 is provided so as to surround the outer circumference of the breakdown voltage structure region 120. Therefore, the depth of the p-type isolation layer 31 needs to be very large in order to form the p-type isolation layer 31 using only thermal diffusion from one main surface of a semiconductor substrate and a high-temperature and a long-term thermal diffusion (drive-in) process is involved. In general, the thermal diffusion is performed in an oxidation atmosphere. The reason is as follows. When an oxide film is formed on the surface of the semiconductor substrate, ions are confined in the semiconductor substrate and the dissipation of ions from the surface of the substrate to the outside of the substrate is prevented by thermal diffusion. In some cases, when the oxide film with a thickness that is more than necessary does not need to be formed during thermal diffusion in terms of the design of the device, oxygen partial pressure is reduced and a heat treatment is performed in a mixed gas atmosphere including other gases (for example, argon (Ar) and nitrogen ($N_2$)) or the heat treatment is performed in an inert gas atmosphere without including oxygen.

The active region 110 illustrated in FIG. 8 is a main current path of a vertical IGBT including, for example, an $n^-$ drift region 21, a p-type base region 22, an $n^+$ emitter region 23, a gate insulating film 24, a gate electrode 25, an interlayer insulating film 26, an emitter electrode 29, a p-type collector region 27, and a collector electrode 28. The p-type isolation layer 31 is a p-type region which is formed by the thermal diffusion of boron (B) at a depth that extends from the front surface of the semiconductor substrate to the p-type collector region 27 provided on the rear surface side. A termination portion of a pn junction surface between the p-type collector region 27 and the $n^-$ drift region 21, which is a reverse breakdown voltage junction, is not exposed from a side end surface 30 of a chip which is a cutting surface during chipping, but is exposed from a surface 32 of the breakdown voltage structure region 120 that is protected by an insulating film by the p-type isolation layer 31. Therefore, the reverse blocking IGBT including the p-type isolation layer 31 can improve the reliability of the reverse breakdown voltage.

Figure 5:
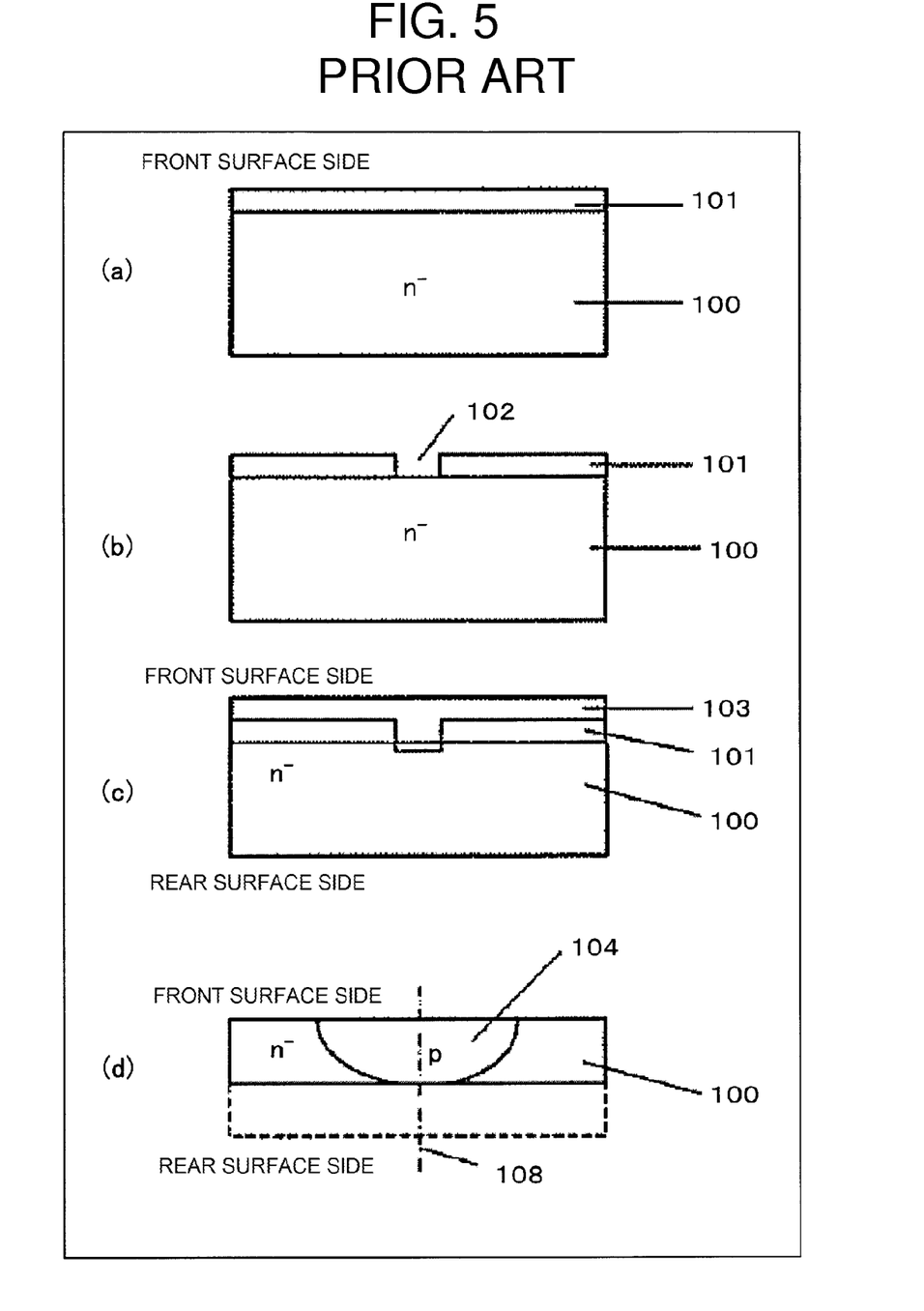
FIG. 5 is a cross-sectional view illustrating the state of an isolation layer which is being formed by coating diffusion according to the related art.
Figure 6:
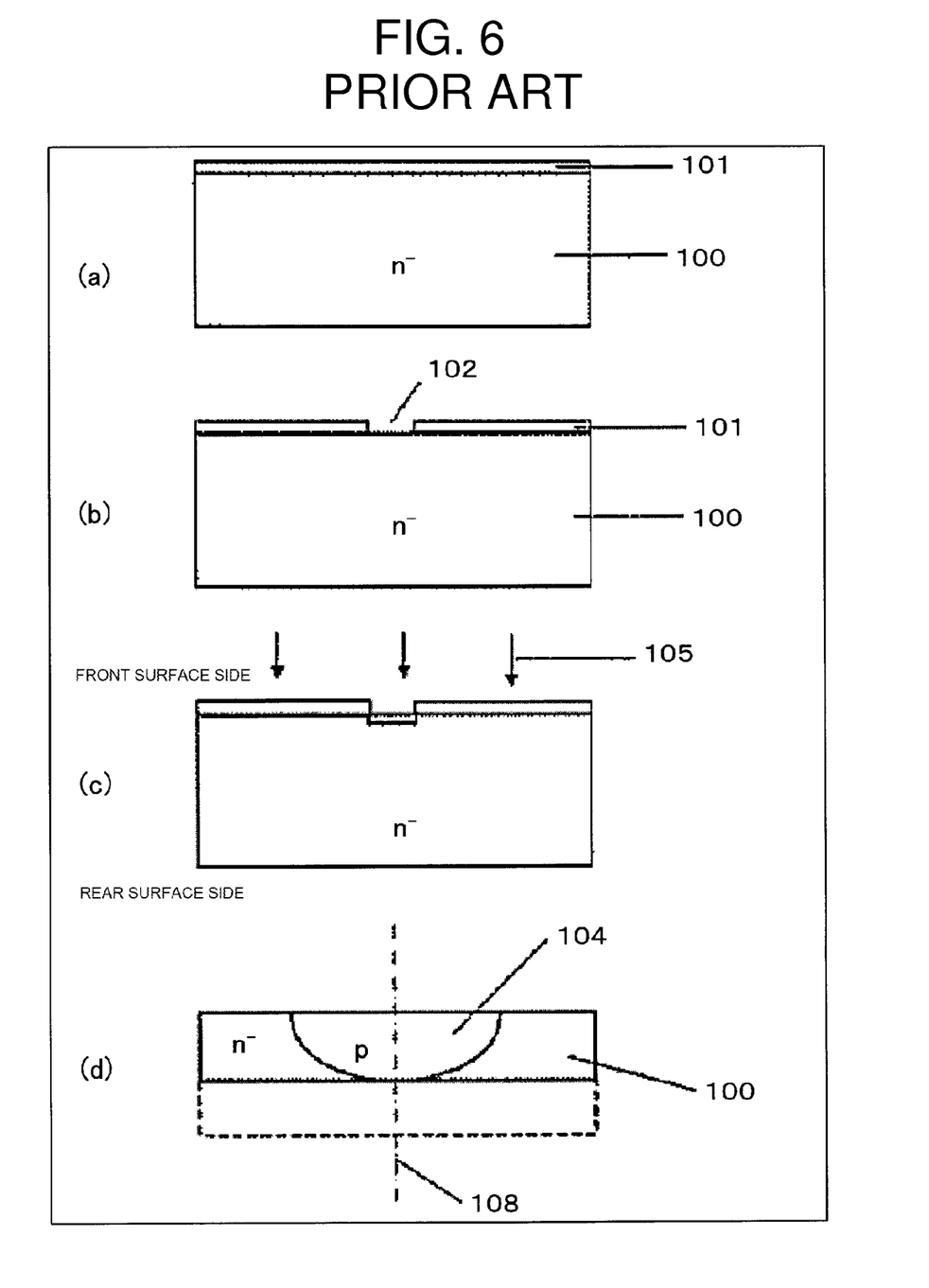
FIG. 6 is a cross-sectional view illustrating the state of an isolation layer which is being formed by ion implantation according to the related art.
Figure 7:
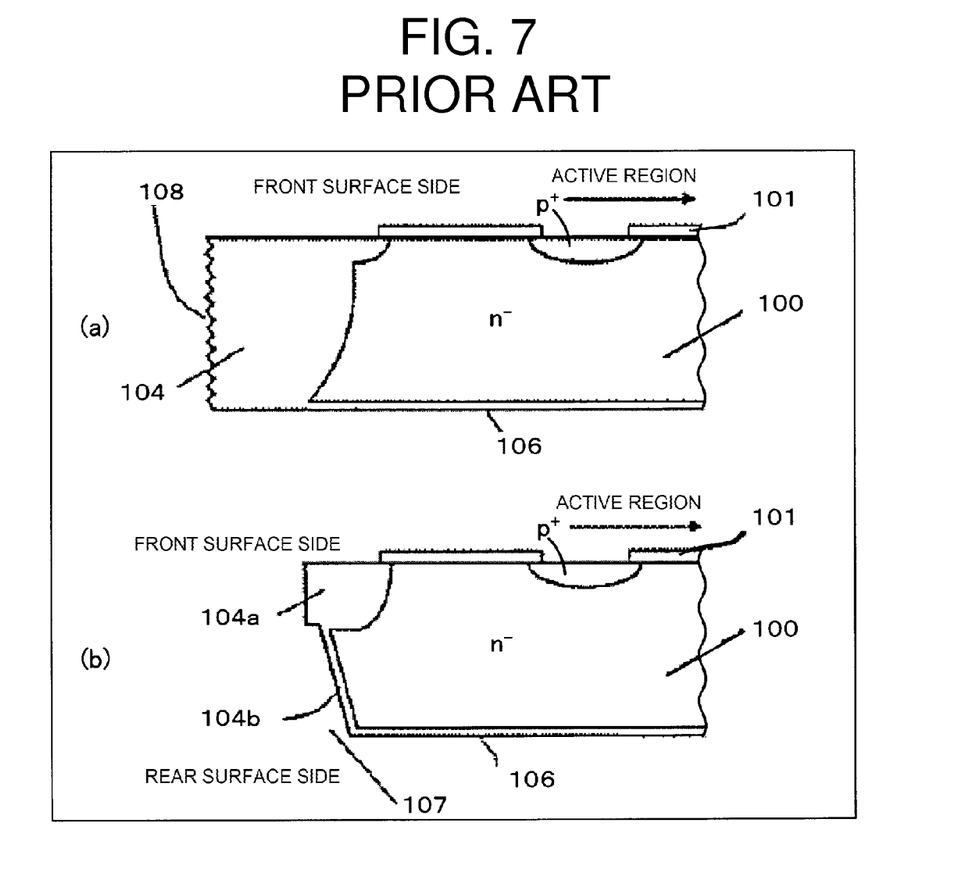
FIG. 7 is a cross-sectional view illustrating the end structure of a reverse blocking IGBT according to the related art.

FIG. 5((a) to (d)) and FIG. 6((a) to (d)) are cross-sectional views sequentially illustrating the manufacturing steps of an impurity diffusion process for forming a p-type isolation layer 104 of the reverse blocking IGBT using coating diffusion and ion implantation, respectively. FIG. 5 is a cross-sectional view illustrating the state of the isolation layer which is being formed by coating diffusion according to the related art. FIG. 6 is a cross-sectional view illustrating the state of the isolation layer which is being formed by ion implantation according to the related art. FIG. 7 is a cross-sectional view illustrating the end structure of a reverse blocking IGBT according to the related art. FIG. 7(a) illustrates the reverse blocking IGBT in which an isolation layer is formed by the diffusion layer that is formed by the manufacturing steps illustrated in FIGS. 5 and 6 so as to pass through a semiconductor substrate. First, a thermally-oxidized film 101 with a thickness of about 1.5 μm to 2.5 μm is formed as a dopant mask on the front surface of a semiconductor substrate 100 with a large thickness of 500 μm or more which is made of silicon (Si) as a semiconductor material (FIG. 5(a) and FIG. 6(a)).

Then, the thermally-oxidized film 101 is patterned to form an opening portion 102 through which impurities for forming the isolation layer are introduced (FIG. 5(b) and FIG. 6(b)). Then, a boron source 103, which is impurities, is coated into the opening portion 102 to form a shallow boron deposit layer (or boron ion implantation 105 is performed for a portion of the semiconductor substrate 100 which is exposed through the opening portion 102 of the thermally-oxidized film 101) (FIG. 5(c) and FIG. 6(c)). Then, the thermally-oxidized film 101 which is used as a dopant mask for the selective diffusion of boron (diffusion for the p-type isolation layer) is removed. Then, a heat treatment is performed at a high temperature (1300° C.) for a long time (100 hours to 200 hours) to form the p-type diffusion layer 104 with a depth of about 100 µm to 200 µm (FIG. 5(d) and FIG. 6(d)). The p-type diffusion layer 104 is used as the isolation layer.

Then, a process (not illustrated) of forming an oxide film on the front surface of the semiconductor substrate 100 surrounded by the p-type diffusion layer 104 again to form a MOS gate structure and a necessary front-surface-side functional region is performed. Then, the rear surface of the semiconductor substrate 100 is ground and removed such that the bottom of the p-type diffusion layer 104 is exposed, as represented by a dashed line, thereby reducing the thickness of the semiconductor substrate 100 (FIG. 5(d) and FIG. 6(d)). A rear surface structure including a p-type collector region and a collector electrode (which are not illustrated) is formed on the ground rear surface and the semiconductor substrate 100 is cut along a scribe line 108 which is disposed in a central portion of the p-type diffusion layer 104. The reverse blocking IGBT which is cut into a chip is illustrated in the cross-sectional views of FIG. 7(a) and FIG. 8.

However, as illustrated in FIGS. 5 and 6, in the reverse blocking IGBT in which the p-type isolation layer is formed by coating diffusion or ion implantation, a high-temperature and long-term thermal diffusion process is needed in order to form a deep p-type isolation layer as described above. As a result, during the high-temperature and long-term thermal diffusion process, an oxygen atom is introduced between the lattices in the semiconductor substrate and an oxygen precipitate, the phenomenon in which oxygen is changed to a donor, or a crystal defect occurs. When the crystal defect is introduced, there is a concern that the amount of leakage current will increase at the pn junction in the semiconductor substrate or the breakdown voltage and reliability of the insulating film formed on the semiconductor substrate will be significantly reduced.

Figure 10:
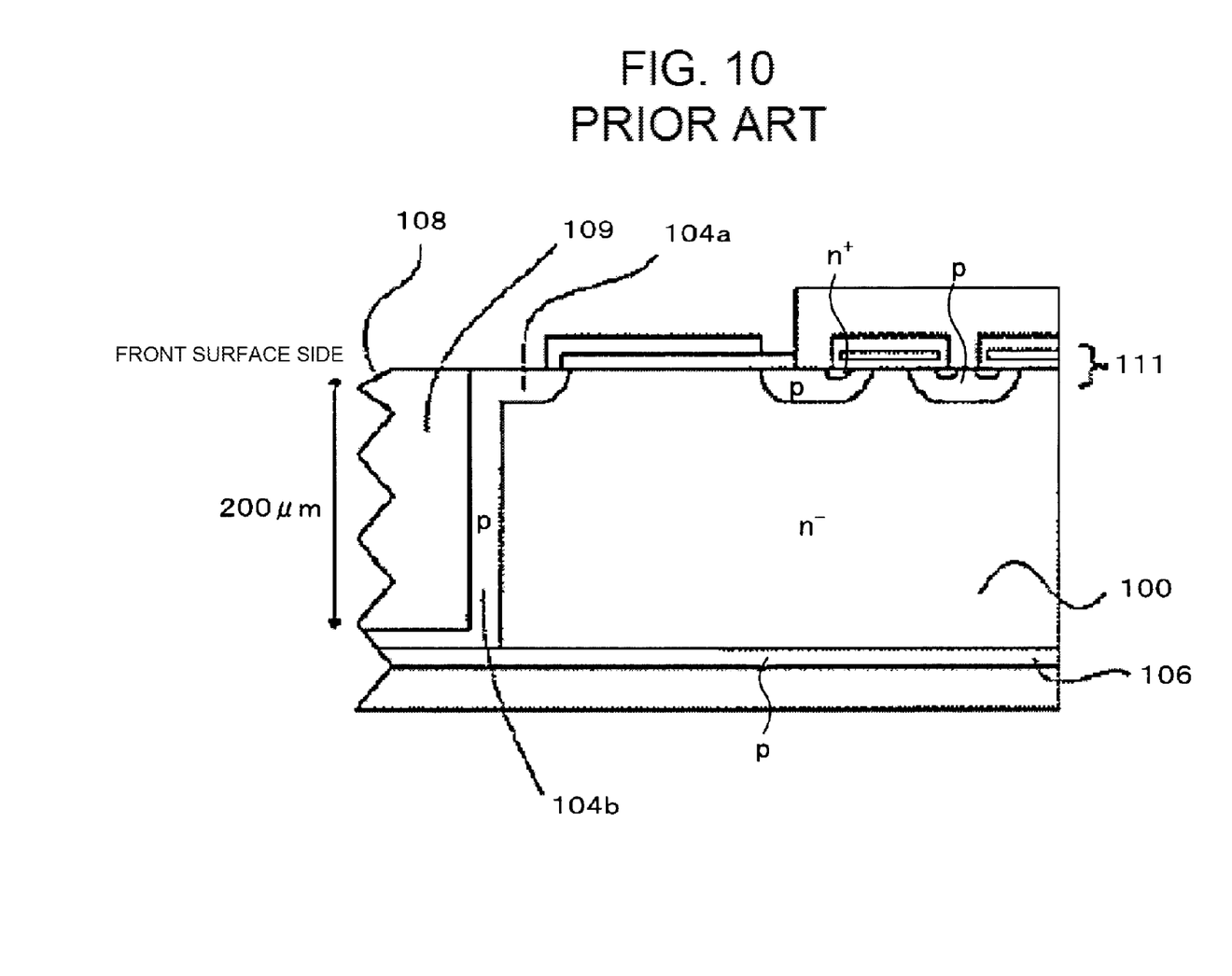
FIG. 10 is a cross-sectional view illustrating the structure of the reverse blocking IGBT according to the related art which includes an isolation layer formed using a trench.

In order to solve the problems caused by the high-temperature and long-term thermal diffusion process, a plurality of methods have been developed which reduce the diffusion depth of the p-type isolation layer to shorten the time required for the high-temperature thermal diffusion process. For example, there is a method which forms a V-shaped groove in the rear surface of a semiconductor substrate to reduce the depth of the isolation layer, thereby shortening the time required for a high-temperature thermal diffusion process for forming an isolation layer (for example, see the following Patent Document 2 to Patent Document 4). FIG. 7(b) illustrates an example of the end structure of a reverse blocking IGBT manufactured by U.S. Pat. No. 7,741,192, JP 2006-303410 A, and JP 2011-181770 A (Patent Document 2 to Patent Document 4, respectively). In addition, a method has been known which forms a trench 109 having a vertical side wall with a depth of depth 200 µm from the front surface of a semiconductor substrate 100 and forms a isolation layer 104b with a small depth on the side wall, thereby reducing the time required for a high-temperature thermal diffusion process, as illustrated in the cross-sectional view of FIG. 10. FIG. 10 is a cross-sectional view illustrating the structure of a reverse blocking IGBT according to the related art including an isolation layer which is formed using a trench. In FIG. 10, reference numeral 106 indicates a p-type collector region, reference numeral 108 indicates a scribe line, and reference numeral 111 indicates a MOS gate structure provided on the front surface side of a substrate.

In the related art, as the semiconductor substrate which is used to manufacture a high breakdown voltage power device, a silicon semiconductor substrate (hereinafter, referred to as an FZ silicon semiconductor substrate) has been used which is cut from a silicon single crystal (hereinafter, referred to as an FZ silicon single crystal) produced by a floating zone (FZ) method using polysilicon (hereinafter, referred to as FZ polysilicon). The FZ silicon semiconductor substrate has advantages including that dislocation included in the crystal is small and the content of oxygen is small, as compared to a silicon semiconductor substrate (hereinafter, referred to as a CZ silicon semiconductor substrate) that is cut from a silicon single crystal (hereinafter, referred to as a CZ silicon single crystal) produced by a Czochralski (CZ) method. Therefore, the FZ silicon single crystal is particularly indispensable as a silicon crystal for a power device with a high breakdown voltage and high current capacity. An FZ silicon semiconductor substrate with a large diameter is required in order to reduce the costs of the device. However, it is difficult to increase the diameter of the FZ silicon semiconductor substrate, as compared to the CZ silicon semiconductor substrate.

In general, as described above, FZ polysilicon is used as a raw material for the FZ silicon single crystal. However, the FZ polysilicon which is required as a raw material in the FZ method needs to have high purity, to be less likely to be cracked or broken, to have a uniform grain-boundary structure, to have a diameter suitable for the FZ silicon single crystal to be produced, and to have a cylindrical shape which is flat, has a large crank, and has a good surface state. Manufacturing yield or productivity in the production of the FZ polysilicon is significantly less than that in the production of nugget-shaped polysilicon used in the CZ method (hereinafter, referred to as CZ polysilicon). There is an increasing demand for the CZ polysilicon with a diameter of 300 mm. A method has been known which produces an FZ silicon single crystal with a large diameter, using, as a raw material, a silicon single crystal produced by the CZ method capable of producing a large-diameter single crystal silicon stably (compared to the FZ method), instead of the FZ polysilicon according to the related art (for example, see the following Patent Document 5). Hereinafter, a silicon semiconductor substrate which is cut from the FZ silicon single crystal produced by this method is referred to as a CZ-FZ silicon semiconductor substrate.

However, as described above, in the method disclosed in the above-mentioned Patent Document 2 to Patent Document 4 in which the V-shaped groove is formed in the rear surface of the semiconductor substrate, the depth of the p-type diffusion layer 104a from the front surface of the substrate is reduced to reliably shorten the thermal diffusion time at a high temperature. However, when the depth of the p-type diffusion layer 104a is too small, another problem occurs. Specifically, when the depth of the diffusion layer 104a from the front surface of the substrate is reduced in order to shorten the thermal diffusion time at a high temperature, the depth of the V-shaped groove needs to be increased by a value corresponding to the reduction in the depth. As a result, a new problem occurs, i.e., the semiconductor substrate 100 is likely to be broken.

In the method which forms the p-type isolation layer 104b using the trench 109 with the side wall vertical to the main surface to reduce the thermal diffusion time at a high temperature as illustrated in FIG. 10, the following problem occurs. For example, when a typical dry etching device is used, the time required to etch each trench 109 with a depth of about 200 µm is about 100 minutes. Therefore, for example, when the p-type isolation layer 104b is formed using the trench 109, the lead time increases and the number of maintenances increases.

In the high-temperature and long-term thermal diffusion process described with reference to FIGS. 5 to 7, when the above-mentioned CZ-FZ silicon semiconductor substrate is used, the yield of the semiconductor device is reduced (lowered) by the influence of crystal defects which synergistically occur due to vacancies that are included in the substrate at the beginning (before a semiconductor device manufacturing process) and crystal defects which newly occur in the semiconductor substrate due to an atmosphere gas species during a thermal diffusion process, as compared to the case in which the FZ silicon semiconductor substrate according to the related art is used.

That is, a precipitate is generated in the semiconductor substrate depending on the heat treatment condition. A crystal defect, such as a stacking fault, occurs due to the precipitate. There is a concern that the crystal defect will have an adverse effect on the electrical characteristics of the semiconductor device which is manufactured using the semiconductor substrate. A representative example of the crystal defect is an oxygen precipitate ($SiO_2$) which is generated when a heat treatment is performed on the CZ silicon semiconductor substrate. Oxygen which is dissipated from a quartz crucible, which is a container, while a CZ silicon ingot (CZ silicon crystal) is being pulled up is introduced into the CZ silicon ingot and is precipitated as $SiO_2$ when a heat treatment is performed.

When the crystal defect which occurs with the precipitation of $SiO_2$ is present in the vicinity of the pn junction of the semiconductor device, junction leakage or breakdown voltage failure is caused by the crystal defect. Therefore, in a horizontal semiconductor device, such as large scale integration (LSI), in general, measures to perform a heat treatment to perform the oxygen precipitate from being generated in an active portion in the vicinity of the front surface of the semiconductor substrate are taken. In a high-power vertical semiconductor device, such as an IGBT, a current flows in the entire semiconductor substrate from the front surface to the rear surface of the semiconductor substrate. Therefore, only the structure in which the heat treatment is performed on the CZ silicon semiconductor substrate to prevent the generation of the oxygen precipitate in the vicinity of the front surface of the substrate is not sufficient.

Therefore, in general, the FZ silicon ingot is produced by the FZ method which can prevent the mixture of oxygen during the production of the ingot, in order to manufacture the semiconductor substrate used in the vertical semiconductor device. The use of the FZ silicon ingot makes it possible to prevent the generation of the oxygen precipitate and to reduce the deterioration of the electrical characteristics of the vertical semiconductor device in which a current flows in the entire surface of the substrate. However, precipitates other than the oxygen precipitate are generated when the heat treatment is performed on the semiconductor substrate.

In recent years, with an increase demand for a polysilicon rod material which is a raw material of the FZ silicon ingot, the FZ silicon ingot has been produced using the CZ silicon ingot, not the polysilicon rod, as a raw material. In this method, when oxygen included in the CZ silicon ingot is diffused to the outside during melting using induction heating and recrystallization is performed, the concentration of oxygen included in the FZ silicon ingot is reduced and a FZ silicon ingot with a low oxygen concentration is produced.

However, in the CZ-FZ silicon semiconductor substrate which is cut from the FZ silicon ingot that is produced using the CZ silicon ingot, when a heat treatment is performed at a high temperature (for example, 1300° C.) for a long time (for example, 100 hours) in order to form a deep conductive layer, in some cases, a precipitate is generated and the electrical characteristics of the semiconductor device deteriorate. Microscopic analysis proves that the precipitate is a nitrogen precipitate ($\alpha$-$Si_3N_4$). The nitrogen precipitate is caused by a heat treatment which is performed in an atmosphere including nitrogen. As a method for preventing the generation of the nitrogen precipitate, there is a method which performs a heat treatment in a mixed gas atmosphere of argon and oxygen. In a high-temperature and long-term heat treatment which is performed in a mixed gas atmosphere of argon and oxygen, argon is generally used as a raw material gas, which results in an increase in costs.

The invention has been made in order to solve the above-mentioned problems of the related art and an object of the invention is to provide a method for manufacturing a semiconductor device which can suppress the occurrence of crystal defects in a silicon semiconductor substrate due to high-temperature and long-term thermal diffusion, even when including a step of performing the high-temperature and long-term thermal diffusion at a temperature of 1290° C. or more for a time of 100 hours or more to form a deep diffusion layer using a silicon semiconductor substrate that is cut from an FZ silicon crystal produced with a CZ silicon crystal.

SUMMARY OF THE INVENTION

In order to solve the above-mentioned problems and achieve the object of the invention, a method for manufacturing a semiconductor device according to an aspect of the invention has the following characteristics. A silicon semiconductor substrate which is manufactured by a floating zone method is provided; and a diffusion step of thermal diffusion is performed at a heat treatment temperature that is equal to or higher than 1290° C. and is lower than a melting temperature of a silicon crystal to form a diffusion layer with a depth of 50 μm or more in a silicon semiconductor substrate which is manufactured by a floating zone method is performed. In the diffusion step, a first heat treatment is performed in an oxygen atmosphere or a mixed gas atmosphere of oxygen and inert gas, followed by a second heat treatment performed in a nitrogen atmosphere or a mixed gas atmosphere of nitrogen and oxygen to form the diffusion layer.

In the method for manufacturing a semiconductor device according to the above-mentioned aspect of the invention, a semiconductor substrate that is cut from an FZ silicon crystal, which is produced by the floating zone method using FZ polysilicon as a raw material, may be used as the silicon semiconductor substrate.

In the method for manufacturing a semiconductor device according to the above-mentioned aspect of the invention, a CZ-FZ silicon semiconductor substrate that is cut from a CZ-FZ silicon crystal, which is produced by the floating zone method using CZ polysilicon as a raw material, may be used as the silicon semiconductor substrate.

In the method for manufacturing a semiconductor device according to the above-mentioned aspect of the invention, when a thickness of the silicon semiconductor substrate is L (μm), a processing time t (hour) of the first heat treatment may satisfy $t > 3.5 \times 10^{-6} \times L^2$.

In the method for manufacturing a semiconductor device according to the above-mentioned aspect of the invention, when a thickness of the silicon semiconductor substrate is L (μm) and a diffusion coefficient of an interstitial silicon atom at a processing temperature T of the first heat treatment is DT (μm²/h), a processing time t (hour) of the first heat treatment may satisfy t>L²/(16×DT).

In the method for manufacturing a semiconductor device according to the above-mentioned aspect of the invention, when a thickness of a silicon substrate corresponding to a breakdown voltage is M (μm), a processing time t (hour) of the first heat treatment may satisfy t>3.5×10⁻⁶×M².

In the method for manufacturing a semiconductor device according to the above-mentioned aspect of the invention, when a thickness of a silicon substrate corresponding to a breakdown voltage is M (μm) and a diffusion coefficient of an interstitial silicon atom at a processing temperature T of the first heat treatment is DT (μm²/h), a processing time t (hour) of the first heat treatment may satisfy t>M²/(16×DT).

In the method for manufacturing a semiconductor device according to the above-mentioned aspect of the invention, the diffusion layer formed during performing thermal diffusion may provide an isolation layer forming a reverse blocking insulated gate bipolar transistor.

According to the method for manufacturing a semiconductor device of the invention, even when high-temperature and long-term thermal diffusion is performed at a temperature of 1290° C. or more for a time of 100 hours or more to form a deep diffusion layer using a silicon semiconductor substrate that is cut from an FZ silicon crystal which is produced by an FZ method with a CZ silicon crystal in order to increase a diameter and to reduce costs, it is possible to suppress the occurrence of a crystal defect in the semiconductor substrate due to the high-temperature and long-term thermal diffusion. In addition, according to the method for manufacturing a semiconductor device of the invention, it is possible to reduce the amount of inert gas, which is raw material gas used when the high-temperature and long-term thermal diffusion is performed. Therefore, it is possible to reduce manufacturing costs.

DETAILED DESCRIPTION OF THE INVENTION

Hereinafter, a preferred embodiment of a method for manufacturing a semiconductor device according to the invention will be described in detail with reference to the accompanying drawings. In the specification and the accompanying drawings, in the layers or regions having "n" or "p" appended thereto, an electron or a hole means a majority carrier. In addition, symbols "+" and "−" added to n or p mean that impurity concentration is higher and lower than that of the layer without the symbols. In the description of the following embodiment and the accompanying drawings, the same components are denoted by the same reference numerals and the description thereof will not be repeated. In addition, in the accompanying drawings described in the embodiment, for ease of viewing or understanding, a scale and a dimensional ratio are different from the actual scale and dimensional ratio. The invention is not limited to the following embodiment as long as it does not depart from the scope and spirit thereof.

Embodiment

Hereinafter, as an example of a method for manufacturing a semiconductor device according to an embodiment of the invention, a method will be described which manufactures a reverse blocking IGBT with a breakdown voltage of 600 V using a floating zone (FZ) silicon (Si) semiconductor substrate (CZ-FZ silicon semiconductor substrate) that is cut from an FZ silicon single crystal (FZ silicon crystal ingot) produced by an FZ method using a Czochralski (CZ) silicon ingot (CZ silicon crystal) as a raw material, in order to increase a diameter and to reduce costs. The CZ silicon ingot is a CZ silicon single crystal which is produced by a CZ method using nugget-shaped polysilicon (CZ polysilicon) as a raw material. In particular, a diffusion process for forming a deep diffusion layer using high-temperature and long-term thermal diffusion (drive-in) which is the characteristics of the invention, for example, an isolation layer with a depth that extends from the front surface to the rear surface of a semiconductor substrate will be described. Most of the following diffusion process uses the process of manufacturing the reverse blocking IGBT according to the related art which has been described above with reference to FIG. 6 and FIG. 7(a).

Figure 1:
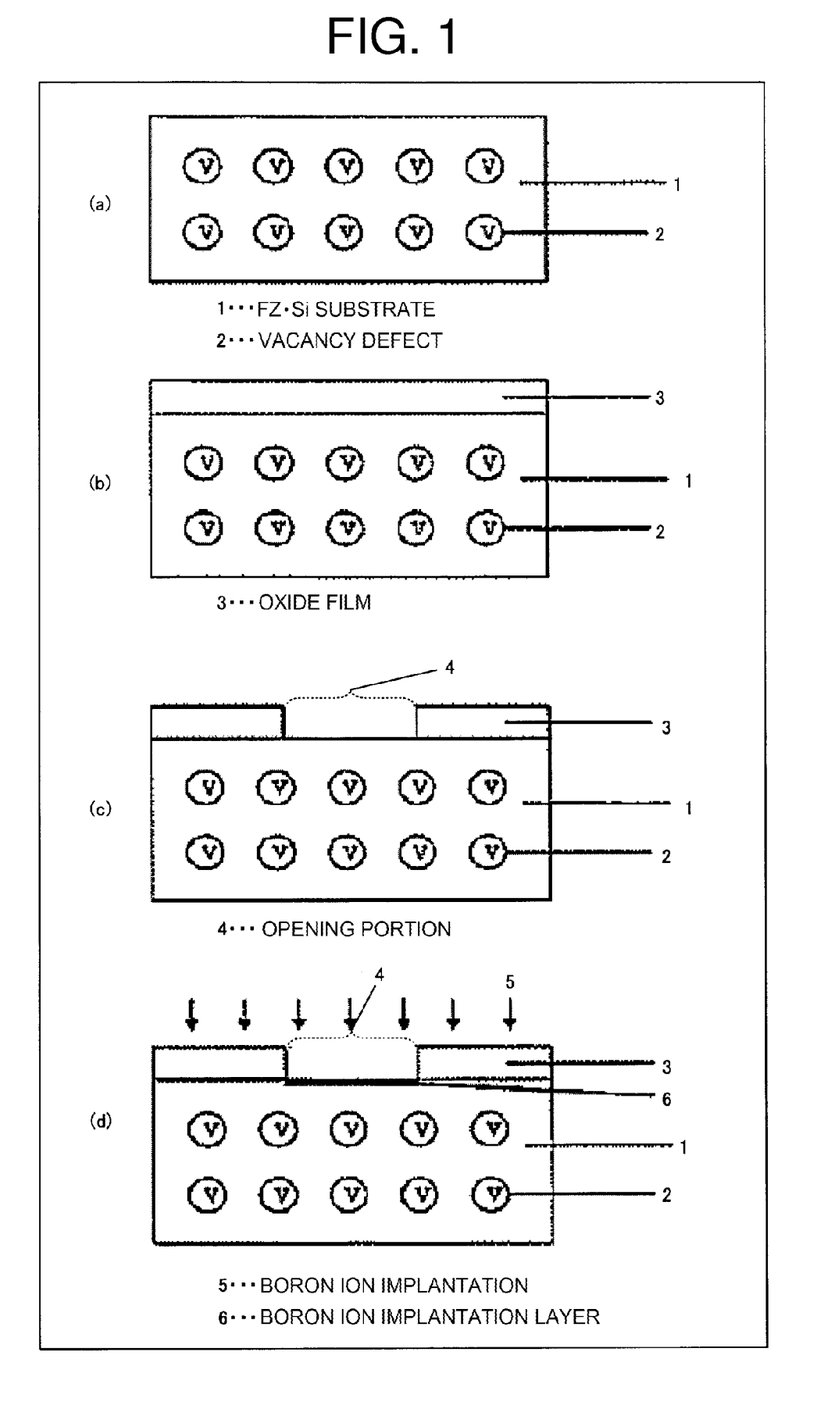
FIG. 1 is a cross-sectional view schematically illustrating the state of a CZ-FZ silicon semiconductor substrate while a semiconductor device according to an embodiment of the invention is being manufactured.
Figure 2:
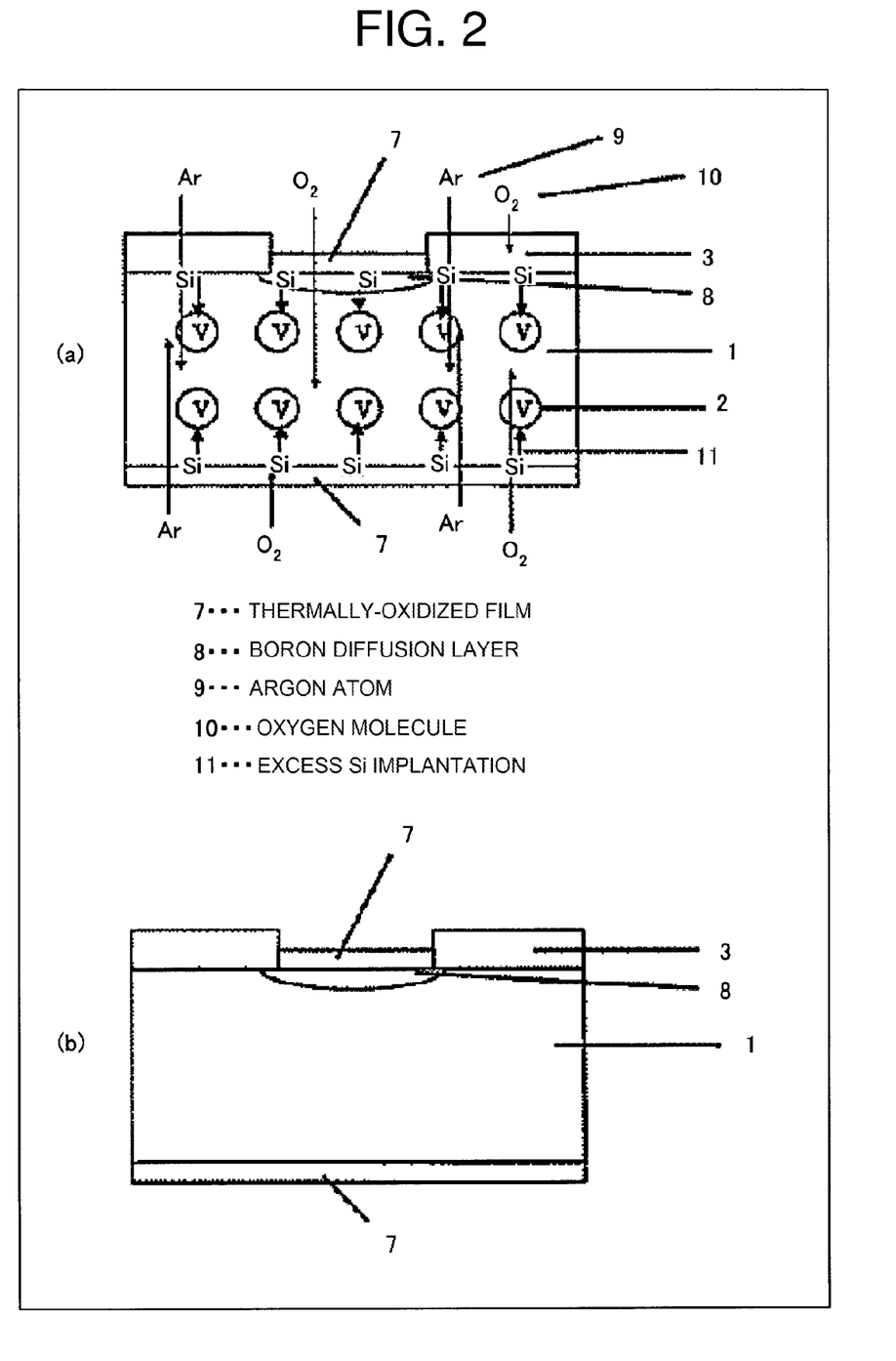
FIG. 2 is a cross-sectional view schematically illustrating the state of the CZ-FZ silicon semiconductor substrate while the semiconductor device according to the embodiment of the invention is being manufactured.
Figure 3:
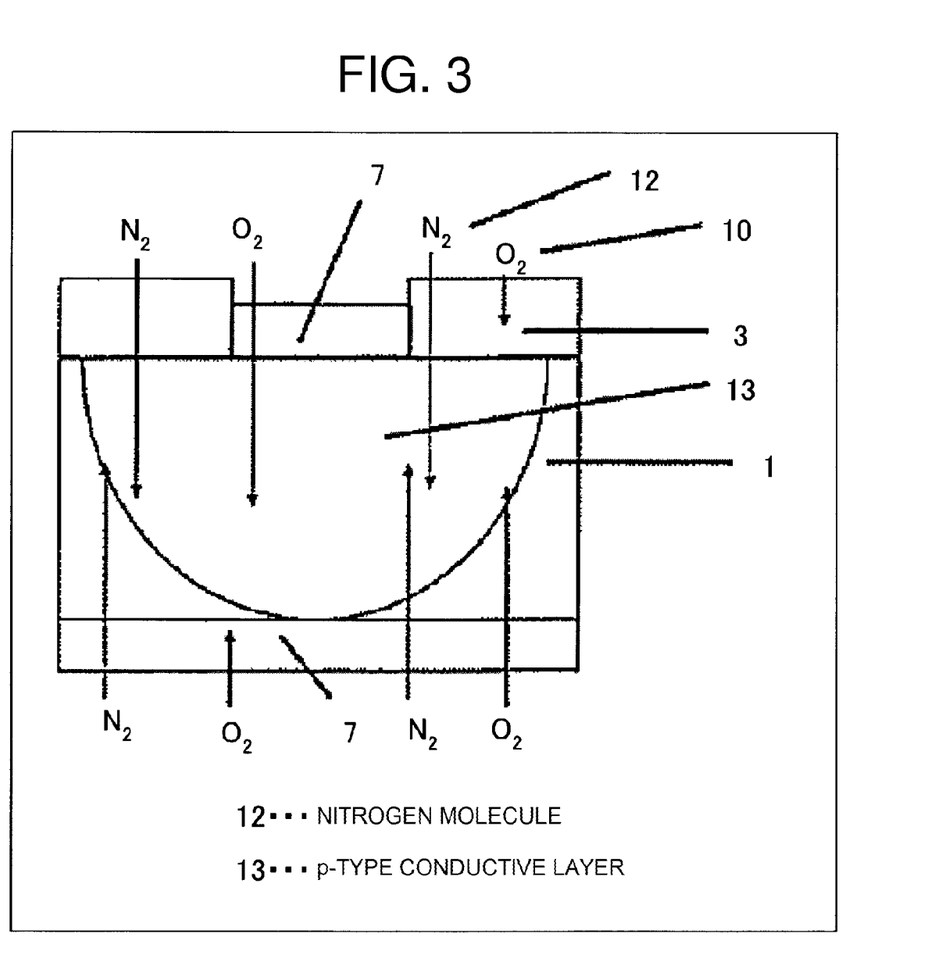
FIG. 3 is a cross-sectional view schematically illustrating the state of the CZ-FZ silicon semiconductor substrate while the semiconductor device according to the embodiment of the invention is being manufactured.

The method for manufacturing the reverse blocking IGBT according to the embodiment of the invention differs from the method for manufacturing the reverse blocking IGBT according to the related art in that, in the method for manufacturing the reverse blocking IGBT according to the embodiment of the invention, high-temperature and long-term thermal diffusion for the isolation layer includes a first heat treatment which is performed in an oxygen (O₂) atmosphere or a mixed gas atmosphere of oxygen and inert gas and a second heat treatment which is performed in a nitrogen (N₂) atmosphere or a mixed gas atmosphere of nitrogen and oxygen after the first heat treatment. FIGS. 1 to 3 are cross-sectional views schematically illustrating the state of the CZ-FZ silicon semiconductor substrate while the semiconductor device according to the embodiment of the invention is being manufactured. First, a CZ-FZ silicon semiconductor substrate 1 is prepared. In some cases, vacancy defects 2 (V: Vacancy) are partially present in the CZ-FZ silicon semiconductor substrate 1 in an initial state (before a semiconductor device manufacturing process) (FIG. 1(a)). Since the vacancy defect 2 has a very small size, it is difficult to directly detect the vacancy defect 2 (in the drawings, the vacancy defect 2 is enlarged).

Then, thermal oxidation is performed on the CZ-FZ silicon semiconductor substrate 1 in an atmosphere without including nitrogen to form an oxide film 3 with a thickness (film thickness) of about 1 μm as a dopant mask on the front surface of the CZ-FZ silicon semiconductor substrate 1 (FIG. 1(b)). Then, patterning and etching are performed on the oxide film 3 to form an opening portion 4 for forming a conductive layer (FIG. 1(c)). Then, the implantation 5 of boron (B) ions (boron ion implantation) is performed with a high dose of about $10^{15}$ cm$^{-2}$ on a portion of the CZ-FZ silicon semiconductor substrate 1 which is exposed through the opening portion 4 to form a boron ion implantation layer 6 (FIG. 1(d)).

Then, for example, the first heat treatment is performed at a temperature of 1300° C. for 10 hours in a mixed gas atmosphere of 30% of oxygen ($O_2$) 10 and 70% of argon (Ar) 9. A furnace entrance temperature and a furnace exit temperature are, for example, 700° C. and the rate of temperature increase and decrease is 1° C./minute. In this way, the exposed portion of the CZ-FZ silicon semiconductor substrate 1 is oxidized and a thermally-oxidized film 7 is formed. In addition, the boron ions implanted into the boron ion implantation layer 6 by the boron ion implantation 5 are diffused to form a boron diffusion layer 8. FIG. 2 is a schematic diagram illustrating the cross-sectional structure of the CZ-FZ silicon semiconductor substrate 1 at this time. Extra Si atoms which are generated with thermal oxidation by the first heat treatment are introduced as interstitial atoms (hereinafter, referred to as interstitial Si atoms) into the CZ-FZ silicon semiconductor substrate 1 by implantation 11 (FIG. 2(a)) and the vacancy defects 2 are filled with the interstitial Si atoms (FIG. 2(b)).

Then, for example, the second heat treatment is performed at a temperature of 1300° C. for 90 hours in a mixed gas atmosphere of 30% of oxygen ($O_2$) 10 and 70% of nitrogen ($N_2$) 12. In this way, the boron ions in the boron diffusion layer 8 are further diffused and a p-type conductive layer 13 is formed so as to extend from the front surface to the rear surface of the CZ-FZ silicon semiconductor substrate 1. FIG. 3 is a schematic diagram illustrating the cross-sectional structure at this time. Even when the second heat treatment is performed in an atmosphere including nitrogen is performed, there is no vacancy defect 2, which is a starting point where a nitrogen precipitate is generated, in the CZ-FZ silicon semiconductor substrate 1 because the vacancy defects 2 have been filled with the interstitial Si atoms in the CZ-FZ silicon semiconductor substrate 1 by the first heat treatment. Therefore, a nitrogen precipitation phenomenon does not occur.

Figure 4:
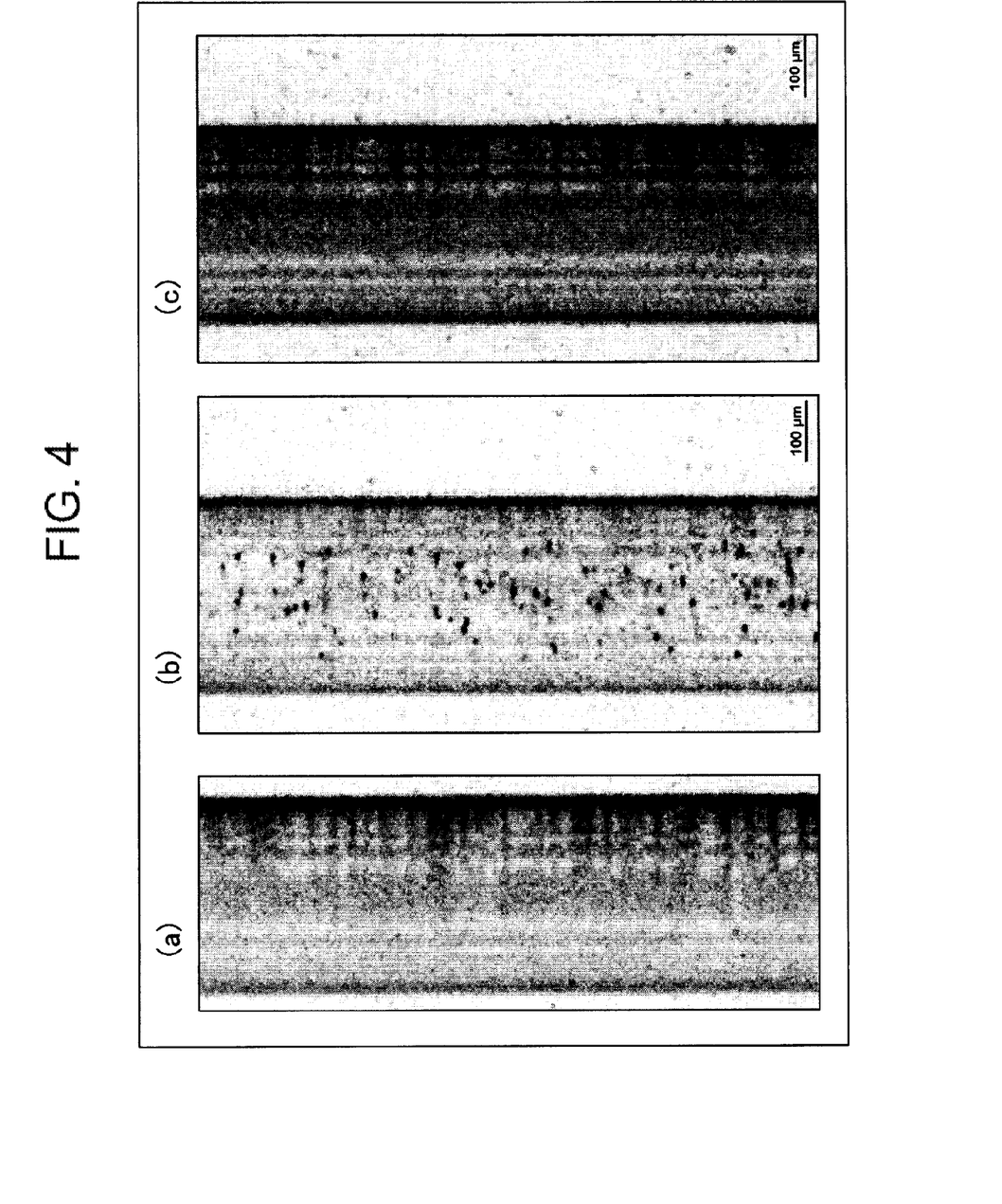
FIG. 4 is a cross-sectional view illustrating a cross-sectional X-ray topograph of the CZ-FZ silicon semiconductor substrate.

Next, the observation result of the cross-section of the CZ-FZ silicon semiconductor substrate 1 after the first and second heat treatments will be described. FIG. 4 is a cross-sectional view illustrating the cross-sectional X-ray topograph of the CZ-FZ silicon semiconductor substrate. FIG. 4(a) is a diagram illustrating the cross-sectional X-ray topograph of the CZ-FZ silicon semiconductor substrate 1 when the first heat treatment is performed at a temperature of 1300° C. for 10 hours in a mixed gas atmosphere of 30% of oxygen ($O_2$) 10 and 70% of argon (Ar) 9 and then the second heat treatment is performed at a temperature of 1300° C. for 90 hours in a mixed gas atmosphere of 30% of oxygen ($O_2$) 10 and 70% of nitrogen ($N_2$) 12 (hereinafter, referred to as an example). As a comparative example, FIG. 4(b) is a diagram illustrating the cross-sectional X-ray topograph of the CZ-FZ silicon semiconductor substrate 1 when a heat treatment is performed at a temperature of 1300° C. for 100 hours in a mixed gas atmosphere of 30% of oxygen ($O_2$) and 70% of nitrogen ($N_2$) (hereinafter, referred to as Comparative Example 1). As illustrated in FIGS. 4(a) and 4(b), in the example, a change in contrast due to a defect caused by a nitrogen precipitate was not observed, unlike Comparative Example 1. In addition, as a comparative example, FIG. 4(c) is a diagram illustrating the cross-sectional X-ray topograph of the CZ-FZ silicon semiconductor substrate 1 when a heat treatment is performed at a temperature of 1300° C. for 100 hours in a mixed gas atmosphere of 30% of oxygen ($O_2$) and 70% of argon (Ar) (hereinafter, referred to as Comparative Example 2). As illustrated in FIGS. 4(a) and 4(c), in the example, it was confirmed that no nitrogen precipitate was generated and a deep conductive layer could be formed in the substrate, similarly to Comparative Example 2. In all of FIGS. 4(a), 4(b), and 4(c) illustrating the cross-sectional X-ray topographs, contract in the vertical direction is seen. The contrast is called a Pendellosung fringe which is generated by a dynamic diffraction phenomenon when crystal perfection is high and is not a crystal defect.

In this embodiment, in the first heat treatment which is performed in a mixed gas atmosphere of 30% of oxygen ($O_2$) 10 and 70% of argon (Ar) 9, the heat treatment temperature is 1300° C. and the heat treatment time is 10 hours. However, the heat treatment temperature and the heat treatment time may be changed to various values as long as the vacancy defects 2 which are present in the CZ-FZ silicon semiconductor substrate 1 in the initial state can be filled with the interstitial Si atoms. Hereinafter, the conditions will be described.

A diffusion coefficient D of the interstitial Si atom, the heat treatment time t(h) of the first heat treatment, and a diffusion length X (concentration 1/e) satisfy the relationship $X = 2\sqrt{(Dt)}$. When the value of the diffusion coefficient calculated by MATSUMOTO Satoru, "Self-diffusion in Semiconductors Using Highly Pure Isotope Heterostructures" (Japan Society of Applied Physics, Applied Physics 80 (2011), pp. 987-990) is extrapolated to a high-temperature region and the heat treatment temperature is 1300° C., the diffusion coefficient D is $5.0 \times 10^{-8}$ (cm$^2$/s)=$1.8 \times 10^4$ (μm$^2$/h). In addition, when the first heat treatment is performed on the CZ-FZ silicon semiconductor substrate 1, the implantation 11 of the interstitial Si atoms is performed on the front and rear surfaces of the substrate. Therefore, when the thickness of the CZ-FZ silicon semiconductor substrate 1 is L (μm) and the heat treatment time t of the first heat treatment in the oxidation atmosphere is longer than a heat treatment time satisfying the relationship $2\sqrt{(Dt)} = L/2$, the implantation 11 of the interstitial Si atoms is performed on the entire CZ-FZ silicon semiconductor substrate 1. From the relational expression, when the diffusion coefficient of the interstitial silicon atom at the processing temperature T of the first heat treatment is DT, the heat treatment time t of the first heat treatment can be represented by $t = L^2/(16 \times DT)$. When the diffusion coefficient, $D = 1.8 \times 10^4$ (μm$^2$/h), of the interstitial Si atom at a heat treatment temperature of 1300° C. is substituted into DT of the above-mentioned expression, the heat treatment time t is $3.47 \times 10^{-6} \times L^2$ (μm²). Therefore, when the thickness L of the CZ-FZ silicon semiconductor substrate 1 is, for example, 500 (μm), the heat treatment time t is 0.87 (h)=52 (min). When the first heat treatment is performed for 52 minutes or more at a heat treatment temperature of 1300° C., the vacancy defects 2 in the CZ-FZ silicon semiconductor substrate 1 can be filled with the interstitial Si atoms. Here, h is time (hour), min is a minute, and s is a second.

In the above description, the heat treatment condition is that the implantation 11 of the interstitial Si atoms is performed on the entire CZ-FZ silicon semiconductor substrate 1 in the thickness direction. In some cases, the CZ-FZ silicon semiconductor substrate 1 is ground to reduce the thickness of the wafer, according to the breakdown voltage of the final semiconductor device. In this case, the implantation 11 of the interstitial Si atoms may be performed on the front surface of the CZ-FZ silicon semiconductor substrate 1 up to the final product thickness of the semiconductor device.

In addition, the first heat treatment may be performed in an atmosphere including other inert gases (for example, helium (He) and neon (Ne)) instead of the argon gas. In addition, the first heat treatment may be performed in an oxygen atmosphere including 100% of oxygen without an inert gas in order to increase the thickness of the thermally-oxidized film 7. In this case, the same effect as described above is obtained.

After the first heat treatment is performed in an oxygen atmosphere or a mixed gas atmosphere of oxygen and inert gas at the heat treatment temperature for the heat treatment time which are determined from the above-mentioned relational expression, the second heat treatment is performed in a nitrogen atmosphere or a mixed gas atmosphere of nitrogen and oxygen. Therefore, it is possible to diffuse boron ions (boron ion implantation layer 6) to a desired depth, without generating a nitrogen precipitate in the CZ-FZ silicon semiconductor substrate 1, and to form the deep p-type conductive layer 13. The heat treatment time of the second heat treatment is set depending on the depth of the p-type conductive layer 13. That is, the heat treatment time of the second heat treatment may be, for example, the time for which the boron diffusion layer 8 formed by diffusion in the first heat treatment can be further diffused by the second heat treatment and the p-type conductive layer 13 can be formed at a desired depth and the sum of the heat treatment time of the first heat treatment and the heat treatment time of the second heat treatment may be more than, for example, 100 hours. In this case, since the vacancy defects 2 in the CZ-FZ silicon semiconductor substrate 1 are filled with the interstitial Si atoms by the first heat treatment, it is possible to form the p-type conductive layer 13 at a desired depth using the second heat treatment, without generating a nitrogen precipitate.

The deep p-type conductive layer 13 which is formed in this way can be used as a p-type isolation layer for holding a reverse breakdown voltage structure of an IGBT with a reverse breakdown voltage structure (reverse blocking IGBT) (for example, see the cross-sectional structure of the reverse blocking IGBT illustrated in FIG. 8). The p-type isolation layer needs to be formed so as to surround the entire peripheral edge of the semiconductor device (semiconductor chip). When the p-type isolation layer is formed only by a thermal diffusion method, it is necessary to form a continuous p-type conductive layer 13 which extends from one main surface to the other main surface of the semiconductor substrate. In addition, the product thickness of the semiconductor substrate used in the semiconductor device is determined by the breakdown voltage of the semiconductor device. For example, in the case of a reverse blocking IGBT with a breakdown voltage of 600 V, the product thickness of the semiconductor substrate is about 100 μm. In the case of a reverse blocking IGBT with a breakdown voltage of 1200 V, the product thickness of the semiconductor substrate is about 180 μm. In the case of a reverse blocking IGBT with a breakdown voltage of 1700 V, the product thickness of the semiconductor substrate is about 240 μm. When the p-type isolation layer is formed by a combination of the thermal diffusion method and a laser annealing method which is performed after ion implantation is performed on a V-shaped groove, it is possible to reduce the thickness of the p-type isolation layer formed by thermal diffusion (for example, see the cross-sectional structure of the reverse blocking IGBT illustrated in FIG. 7(b)). In this case, the thickness of the p-type isolation layer formed by thermal diffusion also needs to be equal to or greater than 50 μm in order to prevent the semiconductor substrate from being broken during a manufacturing process due to a reduction in the mechanical strength of the semiconductor substrate after the V-shaped groove is formed.

In the above description, the heat treatment temperature of the second heat treatment is 1300° C. However, the heat treatment temperature may be 1290° C. When the heat treatment temperature of the second heat treatment is lower than 1290° C., no problem occurs in breakdown voltage characteristics, but the practical problems that a long thermal diffusion time is required and work efficiency is reduced occur, which is not preferable. Specifically, when a deep isolation layer required for a reverse blocking IGBT with a breakdown voltage of 600 V is formed by thermal diffusion, for example, thermal diffusion at a temperature of 1300° C. requires only a heat treatment time of 100 hours. However, thermal diffusion at a temperature of 1280° C. requires a heat treatment time of 150 hours. As a result, work efficiency is reduced. Therefore, it is preferable that the heat treatment temperature of the second heat treatment be equal to or higher than 1290° C. The upper limit of the heat treatment temperature of the second heat treatment can increase to a value at which deformation causing a problem in a wafer process does not occur in the CZ-FZ silicon semiconductor substrate 1. When the CZ-FZ silicon semiconductor substrate 1 is not deformed, the thermal diffusion time is reduced as the thermal diffusion temperature increases, which is preferable. That is, it is preferable that the heat treatment temperature of the second heat treatment be equal to or less than the melting point of Si. The reason is that, at the heat treatment temperature (about 1350° C.), even when the CZ-FZ silicon semiconductor substrate 1 is melted, the shape of the CZ-FZ silicon semiconductor substrate 1 is not changed.

In the first heat treatment, the interstitial Si atoms are diffused to a depth of at least 50 μm or more from the front surface of the wafer and the diffusion speed of the interstitial Si atoms is high. Therefore, as described above, if the first heat treatment satisfies the condition $t > L^2/(16 \times DT)$ or $t > M^2/(16 \times DT)$, no problem occurs even when the thermal diffusion temperature is equal to or higher than 1290° C. and the thermal diffusion time is equal to or less than 100 hours. In addition, when the thermal diffusion temperature is 1300° C., the first heat treatment preferably satisfies the condition $t > 3.5 \times 10^{-6} \times L^2$ or $t > 3.5 \times 10^{-6} \times M^2$, as described above. In these conditional expressions, t is the heat treatment time of the first heat treatment, DT is the diffusion coefficient of the interstitial silicon atoms at the processing temperature T of the first heat treatment, L is the thickness of the CZ-FZ silicon semiconductor substrate 1, and M is the product thickness of the semiconductor substrate (the thickness of the silicon substrate corresponding to the breakdown voltage). In the second heat treatment, in order to form an isolation region of the reverse breakdown voltage structure of the reverse blocking IGBT, a p-type dopant (boron) is diffused to a depth of at least 50 μm or more from the front surface of the wafer. The preferred conditions of the second heat treatment are that the diffusion speed of boron is lower than that of the interstitial Si atom and the thermal diffusion temperature is equal to or higher than 1290° C.

As described above, according to the embodiment of the invention, the first heat treatment is performed in an oxygen atmosphere or a mixed gas atmosphere of oxygen and inert gas to fill the vacancy defects in the CZ-FZ silicon semiconductor substrate. Then, the second heat treatment is performed in an atmosphere including nitrogen to form the diffusion layer, which will be, for example, the isolation layer of the reverse blocking IGBT, at a desired depth, without generating a nitrogen precipitate in the CZ-FZ silicon semiconductor substrate. Therefore, even when a semiconductor device that includes a deep diffusion layer involving thermal diffusion which is performed at a high temperature of 1290° C. or more for a long time of 100 hours or more is manufactured using the CZ-FZ silicon semiconductor substrate in which a crystal defect is likely to occur, in order to increase a diameter and to reduce costs, it is possible to reduce the amount of inert gas, such as argon, which is a raw material gas used in the heat treatment for forming the diffusion layer, to reduce manufacturing costs, and to suppress the generation of a crystal defect.

In the above-described embodiment of the invention, the description is focused on the high-temperature and long-term thermal diffusion process for forming the p-type isolation layer of the reverse blocking IGBT. However, the invention can also be applied to other semiconductor device manufacturing methods including a process of forming a deep diffusion layer using thermal diffusion which is performed at a high temperature of 1290° C. or more for a long processing time of more than 100 hours. In addition, in the above-described embodiment, the semiconductor device is manufactured using the CZ-FZ silicon semiconductor substrate. However, the invention is not limited thereto. An FZ silicon semiconductor substrate which is cut from an FZ silicon single crystal that is produced by the FZ method using FZ polysilicon may be used. In this case, the same effect as described above is obtained. The FZ polysilicon is a polysilicon rod with a substantially cylindrical shape which is used in the FZ method. In addition, in the invention, the conductivity types may be reversed. In this case, the same effect as described above is obtained.

As described above, the semiconductor device manufacturing method according to the invention is useful for a semiconductor device that includes a deep impurity diffusion layer involving high-temperature and long-term thermal diffusion.

It is understood that various other modifications will be apparent to and can be readily made by those skilled in the art without departing from the scope and spirit of the present invention. Accordingly, it is not intended that the scope of the claims appended hereto be limited to the description set forth above but rather that the claims be construed as encompassing all of the features of patentable novelty which reside in the present invention, including all features which would be treated as equivalents thereof by those skilled in the art to which the invention pertains.

What is claimed is:

1. A method for manufacturing a silicon semiconductor substrate including a diffusion layer prior to forming a semiconductor device thereon, comprising:
    providing a silicon semiconductor substrate manufactured by a floating zone method; and
    performing thermal diffusion at a heat treatment temperature that is equal to or higher than 1290° C. and that is lower than a melting temperature of a silicon crystal to form a diffusion layer with a depth of 50 μm or more in the silicon semiconductor substrate, the thermal diffusion including:
    a first heat treatment performed in an atmosphere consisting of oxygen or oxygen and at least one of argon, helium, or neon, gas for a first heat treatment time effective to substantially fill vacancy defects in the silicon semiconductor substrate with interstitial Si atoms and
    a second heat treatment following the first heat treatment and performed in an atmosphere comprised of nitrogen or nitrogen and oxygen for a second heat treatment time to form the diffusion layer without generating a nitrogen precipitate,
    wherein the second heat treatment time is greater than the first heat treatment time.

2. The method according to claim 1, wherein the silicon semiconductor substrate is a silicon semiconductor substrate that is cut from a silicon crystal, which is produced by the floating zone method using polysilicon as a raw material.

3. The method according to claim 1, wherein the silicon semiconductor substrate is a semiconductor substrate that is cut from a silicon crystal, which is produced by the floating zone method using crystal silicon produced by a Czochralski method as a raw material.

4. The method according to claim 1, wherein, when the silicon semiconductor substrate has a thickness L (μm), the first heat treatment has a processing time t (hours) that satisfies $t > 3.5 \times 10^{-6} \times L^2$.

5. The method according to claim 1, wherein, when the silicon semiconductor substrate has a thickness L (μm) and an interstitial silicon atom thereof has a diffusion coefficient at a processing temperature T of the first heat treatment is DT (μm²/h), the first heat treatment has a processing time t (hours) that satisfies $t > L^2/(16 \times DT)$.

6. The method according to claim 1, wherein, when the silicon substrate has a thickness corresponding to a breakdown voltage M (μm), the first heat treatment has a processing time t (hours) that satisfies $t > 3.5 \times 10^{-6} \times M^2$.

7. The method according to claim 1, wherein, when the silicon substrate has a thickness corresponding to a breakdown voltage M (μm) and an interstitial silicon atom thereof has a diffusion coefficient at a processing temperature T of the first heat treatment is DT (μm²/h), the first heat treatment has a processing time t (hours) that satisfies $t > M^2/(16 \times DT)$.

8. The method according to claim 1, wherein the diffusion layer formed during performing thermal diffusion provides an isolation layer of a subsequently-formed reverse blocking insulated gate bipolar transistor.

9. The method according to claim 2, wherein the diffusion layer formed during performing thermal diffusion provides an isolation layer of a subsequently-formed reverse blocking insulated gate bipolar transistor.

10. The method according to claim 3, wherein the diffusion layer formed during performing thermal diffusion provides an isolation layer of a subsequently-formed reverse blocking insulated gate bipolar transistor.

11. The method according to claim 4, wherein the diffusion layer formed during performing thermal diffusion provides an isolation layer of a subsequently-formed reverse blocking insulated gate bipolar transistor.

12. The method according to claim 5, wherein the diffusion layer formed during performing thermal diffusion provides an isolation layer of a subsequently-formed reverse blocking insulated gate bipolar transistor.

13. The method according to claim 6, wherein the diffusion layer formed during performing thermal diffusion provides an isolation layer of a subsequently-formed reverse blocking insulated gate bipolar transistor.

14. The method according to claim 7, wherein the diffusion layer formed during performing thermal diffusion provides an isolation layer of a subsequently-formed reverse blocking insulated gate bipolar transistor.

15. A method for manufacturing a silicon semiconductor substrate including a diffusion layer prior to forming a semiconductor device, comprising:
  providing a silicon semiconductor substrate manufactured by a floating zone method; and
  performing thermal diffusion at a heat treatment temperature that is equal to or higher than 1290° C. and that is lower than a melting temperature of a silicon crystal to form a diffusion layer with a depth of 50 μm or more in the silicon semiconductor substrate that is effective as an isolation layer for a subsequently-formed device, the thermal diffusion including:
    a first heat treatment performed in an atmosphere consisting of oxygen or oxygen and at least one of argon, helium, or neon, gas for a first heat treatment time effective to substantially fill vacancy defects in the silicon semiconductor substrate with interstitial Si atoms so that crystal defects are reduced; and
    a second heat treatment following the first heat treatment and performed in an atmosphere comprised of nitrogen and oxygen for a second heat treatment time to form the diffusion layer without generating a nitrogen precipitate,
  wherein the second heat treatment time is greater than the first heat treatment time and a sum of the first heat treatment time and the second heat treatment time is 100 hours or more.

16. The method according to claim 15, wherein the silicon semiconductor substrate is a silicon semiconductor substrate that is cut from a silicon crystal, which is produced by the floating zone method using polysilicon as a raw material.

17. The method according to claim 15, wherein the silicon semiconductor substrate is a semiconductor substrate that is cut from a silicon crystal, which is produced by the floating zone method using crystal silicon produced by a Czochralski method as a raw material.

18. The method according to claim 15, wherein, when the silicon semiconductor substrate has a thickness L (μm), the first heat treatment has a processing time t (hours) that satisfies $t > 3.5 \times 10^{-6} \times L^2$.

19. The method according to claim 15, wherein, when the silicon semiconductor substrate has a thickness L (μm) and an interstitial silicon atom thereof has a diffusion coefficient at a processing temperature T of the first heat treatment is DT (μm²/h), the first heat treatment has a processing time t (hours) that satisfies $t > L^2/(16 \times DT)$.

20. The method according to claim 15, wherein, when the silicon substrate has a thickness corresponding to a breakdown voltage M (μm), the first heat treatment has a processing time t (hours) that satisfies $t > 3.5 \times 10^{-6} \times M^2$.

21. The method according to claim 15, wherein, when the silicon substrate has a thickness corresponding to a breakdown voltage M (μm) and an interstitial silicon atom thereof has a diffusion coefficient at a processing temperature T of the first heat treatment is DT (μm²/h), the first heat treatment has a processing time t (hours) that satisfies $t > M^2/(16 \times DT)$.

22. The method according to claim 15, wherein the diffusion layer formed during performing thermal diffusion provides an isolation layer of a subsequently-formed reverse blocking insulated gate bipolar transistor.

* * * * *